United States Patent [19]
Hara

[11] Patent Number: 5,191,235
[45] Date of Patent: Mar. 2, 1993

[54] SEMICONDUCTOR INTEGRATED CIRCUIT DEVICE HAVING SUBSTRATE POTENTIAL DETECTION CIRCUIT

[75] Inventor: Takahiro Hara, Tokyo, Japan

[73] Assignee: NEC Corporation, Tokyo, Japan

[21] Appl. No.: 827,000

[22] Filed: Jan. 28, 1992

[30] Foreign Application Priority Data

Jan. 29, 1991 [JP] Japan .................................. 3-28077

[51] Int. Cl.$^5$ .......................... H03K 3/01; H03K 5/22
[52] U.S. Cl. ................................ 307/296.2; 307/355; 307/362; 307/364
[58] Field of Search ............ 307/355, 362, 364, 296.2; 330/257, 288

[56] References Cited

U.S. PATENT DOCUMENTS

| | | | |
|---|---|---|---|
| 4,471,290 | 9/1984 | Yamaguchi | 307/296.2 |
| 4,742,250 | 5/1988 | Tobita | 307/296.2 |
| 4,780,625 | 10/1988 | Zobel | 307/362 |
| 5,043,599 | 8/1991 | Zitta | 307/355 |

FOREIGN PATENT DOCUMENTS 59-122225 7/1984 Japan .
63-224665 9/1988 Japan .

OTHER PUBLICATIONS

Patent Abstract of JP-A-63 224 665.
Patent Abstract of JP-A-59 122 225.

*Primary Examiner*—William L. Sikes
*Assistant Examiner*—Margaret Rose Wambach
*Attorney, Agent, or Firm*—Sughrue, Mion, Zinn, Macpeak & Seas

[57] ABSTRACT

A node potential V1 which is obtained by the division of an internal reference potential and a substrate potential and another node potential V2 which is obtained by the division of the internal reference potential and the ground potential are compared with each other by a current-mirror amplifier. The initial setting of the above two node potentials (V1 and V2) is made as V1>V2. When the substrate potential becomes large in its absolute value, the node potential V1 falls following such change and, when it reaches a predetermined substrate potential, the potentials result in V1<V2. Then, a true output node of the current-mirror amplifier outputs an output of a largely inverted output level which is further amplified by at least one inverter. The semiconductor integrated circuit device is capable of detecting the predetermined substrate potential even if there exist variations in the threshold values in MOS transistors concerned in the fabricating process.

5 Claims, 2 Drawing Sheets

SEMICONDUCTOR INTEGRATED CIRCUIT DEVICE HAVING SUBSTRATE POTENTIAL DETECTION CIRCUIT

BACKGROUND OF THE INVENTION (1) Field of the Invention

The present invention relates to a semiconductor integrated circuit device and, more particularly, to a semiconductor integrated circuit device having a substrate potential detection circuit.

(2) Description of the Related Art

FIG. 1 shows a conventional substrate potential detection circuit used in a semiconductor integrated circuit device, which has a circuit configuration wherein a P-channel MOS transistor (hereinafter referred to as a "PMOS") Q10 and an N-channel MOS transistor (hereinafter referred to as an "NMOS") Q20 are connected in series between a power supply source $V_{CC}$ and a substrate potential source $V_{BB}$. The PMOS Q10 has a source connected to the power supply source $V_{CC}$, a gate connected to the ground, and a drain connected to a detection output (true output) node N1 from which a detection output is derived. The NMOS Q20 has a source connected to the substrate potential source $V_{BB}$, a gate connected to the ground, and a drain connected to the detection output node N1. The detection output from the output node N1 is amplified by serially connected inverters $I_1$ through $I_n$.

Next, how the above circuit operates is explained. The gate-source voltage $V_{GS}$ of the NMOS Q20 is the absolute value of the substrate potential $V_{BB}$ (hereinafter also referred to as "$V_{BB}$") at the source thereof because the potential at the gate electrode thereof is a constant value of the ground potential. On the other hand, the gate-source voltage $V_{GS}$ of the PMOS Q10 becomes $V_{GS} = -V_{CC}$ since the gate is at the ground potential and the source is at a power source voltage $V_{CC}$ (hereinafter also referred to as "$V_{CC}$"). Since this gate-source voltage $V_{GS}$ is sufficiently larger than a threshold voltage of the PMOS Q10, the PMOS Q10 is normally in its conductive state.

Thus, when the substrate potential $V_{BB}$ is shallow (that is, small in its absolute value), the detection output node N1 becomes a high level state (wherein an output of the inverter $I_1$ is rendered substantially to the ground potential) because of a high current driving capability of the PMOS Q10. On the other hand, when the substrate potential $V_{BB}$ becomes deep, and the current driving capability of the NMOS Q20 becomes larger than that of the PMOS Q10, the detection output node N1 becomes a low level state (wherein the output of the inverter $I_1$ is rendered substantially to the power source voltage level).

As readily understood from the above explained operation, a detection level for the substrate potential is a transition point where the detection output node N1 changes from its high level to its low level. In other words, since the detection level is determined by a difference or a ratio between the current driving capability of the NMOS transistor Q20 and that of the PMOS transistor Q10, it is possible to change such detection level by having the sizes of the respective MOS transistors Q10 and Q20 changed.

In the conventional substrate potential detection circuit explained above, the difference between the current driving capability of the PMOS transistor and that of the NMOS transistor is utilized for detecting a change in the substrate potential.

However, since the threshold voltage values of PMOS transistors and NMOS transistors vary due to variations in the parameters involved in the fabricating process whereby the current driving capabilities are caused to deviate from the designed values and, accordingly, the detection level of the substrate potential is also caused to change unavoidably. This is a problem to be solved.

SUMMARY OF THE INVENTION

It is, therefore, an object of the invention to overcome the problems existing in the conventional circuit and to provide an improved substrate potential detection circuit.

According to the present invention, there is provided a semiconductor integrated circuit device provided with a substrate potential detection circuit which outputs a detection signal when the substrate potential reaches a predetermined detection level, the circuit device comprises:

a current-mirror circuit having a first input MOS transistor and a second input MOS transistor;

a first resistor circuit in which a first and a second resistor are connected in series and which divides a potential difference between an internal reference voltage and the substrate potential and produces an input voltage to be supplied to the first input MOS transistor; and a second resistor circuit in which a third and a fourth resistor are connected in series and which divides a potential difference between the internal reference voltage and a ground potential and produces a reference voltage to be supplied to the second input MOS transistor.

In the semiconductor integrated circuit as arranged above, the input voltage and the reference voltage are set such that there is a predetermined high and low relationship between them at an initial state. When the substrate potential changes, the input voltage and the reference voltage are brought into an inverse relation and the current-mirror circuit detects such inversion whereby a detection signal is outputted from the current-mirror circuit.

BRIEF DESCRIPTION OF THE DRAWINGS

The above and other objects, features and advantages of the present invention will be apparent from the following description of preferred embodiments of the invention, with reference to the accompanying drawings, in which.

PREFERRED EMBODIMENTS OF THE INVENTION

Now, preferred embodiments of the invention will be explained with reference to the accompanying drawings.

Figure 1:
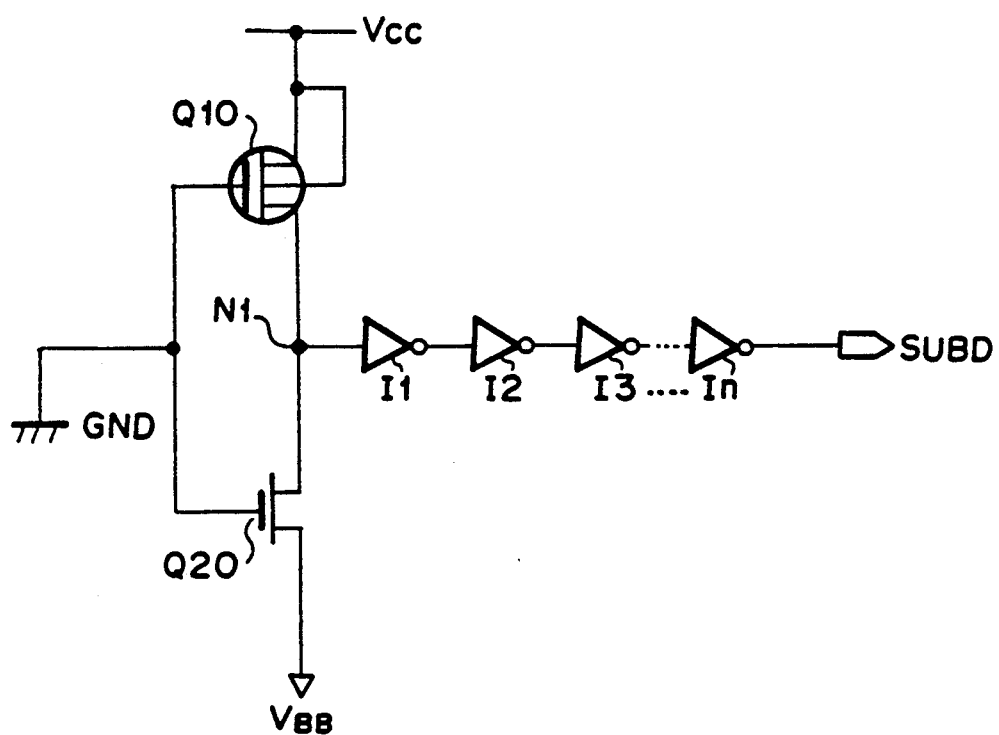
FIG. 1 is a circuit diagram showing a relevant conventional substrate potential detection circuit.
Figure 2:
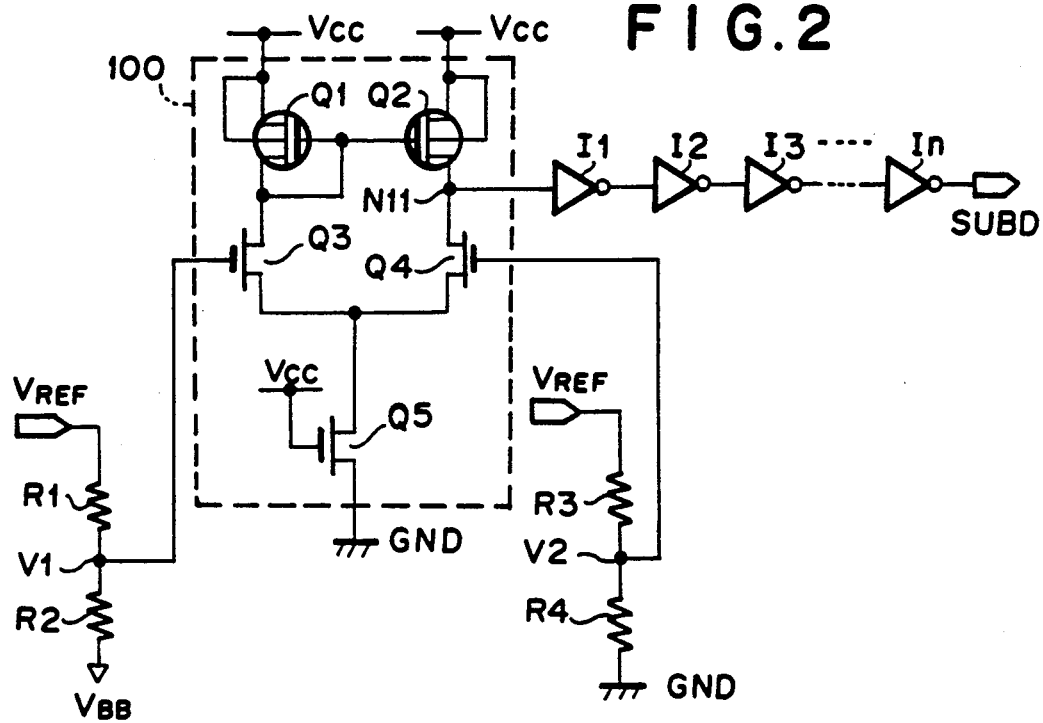
FIG. 2 is a circuit diagram showing a substrate potential detection circuit of an embodiment according to the invention.

FIG. 2 is a circuit diagram showing a substrate potential detection circuit of a first embodiment according to the present invention. The circuit comprises a current-mirror amplifier circuit 100 composed of two PMOS transistors Q1, Q2 and three NMOS transistors Q3 through Q5; a first resistor network composed of resistors R1, R2 connected in series between an internal reference source $V_{REF}$ and the substrate potential source $V_{BB}$, for producing an input voltage; a second resistor network composed of resistors R3, R4 connected between the internal reference source $V_{REF}$ and the ground, for producing a reference voltage. The circuit further comprises a given number of inverters $I_1$ through $I_n$ connected in series to a detection output node N11.

Where the potential difference between the internal reference potential $V_{REF}$ and the substrate potential $V_{BB}$ is divided by the resistors R1, R2, the node potential V1 at the connection between the resistors R1 and R2 can be represented by:

$(R2 \times V_{REF} + R1 \times V_{BB})/(R1+R2)$, and this is applied to one input node of the current-mirror amplifier circuit 100.

On the other hand, where the potential difference between the internal reference potential $V_{REF}$ and the ground potential is divided by the resistors R3, R4, the node potential V2 at the connection between the resistors R3 and R4 can be represented by:

$(R4 \times V_{REF})/(R3+R4)$, and this is applied to the other input node of the current-mirror circuit 100.

The node potential V2 is a fixed potential since the internal reference potential $V_{REF}$ is constant. Thus, the node potential V2 is inputted to the gate of the NMOS transistor Q4 as the reference potential for the current-mirror circuit 100. On the other hand, the node potential V1 is inputted to the gate of the NMOS transistor Q3 as a true input for the same current-mirror circuit 100. The true input V1 becomes small as the substrate potential $V_{BB}$ becomes deep (namely, the absolute value of the substrate potential of negative value becomes large). Thus, if, at the initial state, the resistors R1, R2 and the resistors R3, R4 are set such that the node potential V1 exceeds the node potential V2 where the substrate potential $V_{BB}$ is 0 V, the node potential V1 falls below the node potential V2 when the substrate potential $V_{BB}$ changes and reaches a predetermined potential, whereby the high and low relation between the above two node potentials is inverted. Here, the node potential V1 at the point when the relation between the node potentials V1 and V2 is inverted becomes the detection level of the substrate potential $V_{BB}$.

In short, due to the operation of the current-mirror amplifier circuit 100, when the true input potential V1 is larger than the reference potential V2, the true output node (detection output node) N11 becomes a potential close to the power supply voltage $V_{CC}$ whereas, when the true input potential V1 becomes smaller than the reference potential V2, the true output node N11 largely changes to a potential close to the ground potential.

Further, the potential at the true output node N11 is amplified by the inverters $I_1$ through $I_n$, and an output signal SUBD is outputted from the final inverter $I_n$. In the circuit of the present invention, when the output signal SUBD changes from the power source potential $V_{CC}$ to the ground potential GND (or from the GND to the $V_{CC}$), it is detected that the substrate potential $V_{BB}$ has reached the predetermined detection level.

Figure 3:
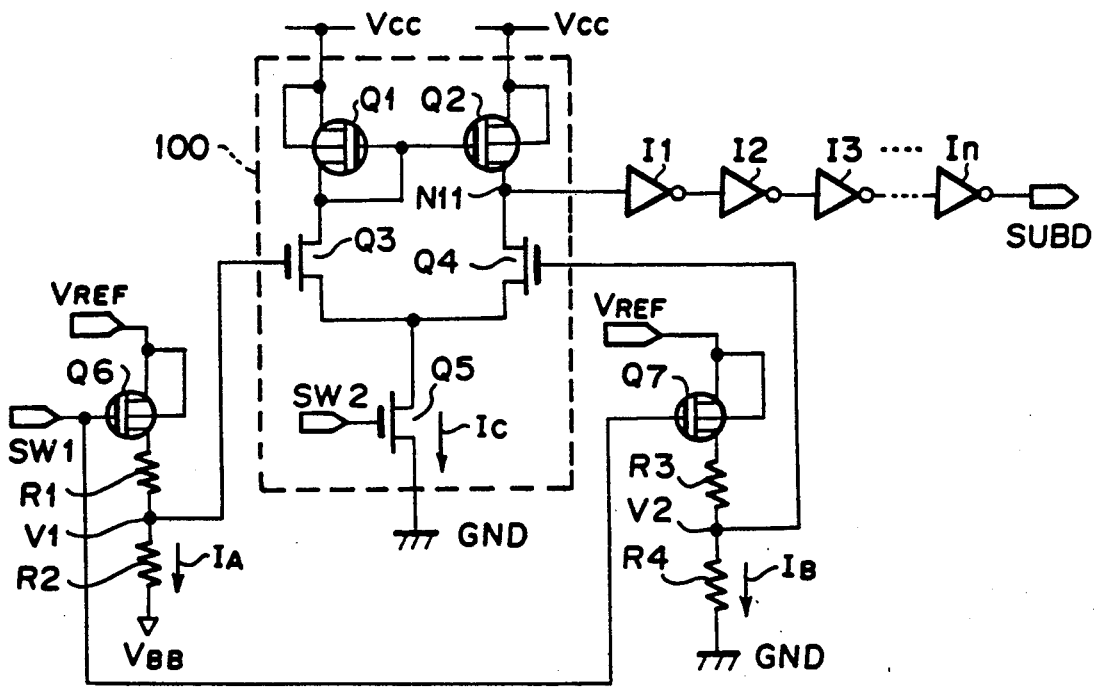
FIG. 3 is a circuit diagram showing a circuit of another embodiment according to the invention.

FIG. 3 shows diagrammatically a detection circuit of a second embodiment according to the invention.

The main point which is different in this embodiment from the above explained first embodiment is that there are additionally provided two switching transistors. Specifically, there is connected a PMOS transistor Q6 between the internal reference source $V_{REF}$ and the resistor R1, and there is connected a PMOS transistor Q7 between the internal reference source $V_{REF}$ and the resistor R3 with a control signal SW1 being commonly inputted to the gates of the PMOSs Q6 and Q7. Also, another control signal SW2 is inputted to the gate of the NMOS Q5 in the current-mirror circuit 100, whereas the gate thereof is fixedly connected to the power supply source $V_{CC}$ in the first embodiment.

The control signals SW1 and SW2 are supplied in order to save the consumption of current by the circuit of the present invention when there is no need to detect the substrate potential and, under such state, the signal SW1 is kept at the internal reference voltage $V_{REF}$ and the signal SW2 is kept at the ground potential GND. When the control signal SW1 becomes the internal reference voltage $V_{REF}$, the PMOS Q6 and the PMOS Q7 both turn off, so that the currents $I_A$, $I_B$ flowing from the internal reference source $V_{REF}$ to the substrate and to the ground are cut off. Also, when the control signal SW2 becomes the ground potential, the current $I_C$ flowing in the current-mirror amplifier circuit 100 is cut off as the NMOS transistor Q5 turns off.

On the other hand, when it is needed to detect the substrate potential, the control signal SW1 is turned to the ground level GND whereby the PMOS transistors Q6, Q7 both turn to their on-states, and the control signal SW2 is turned to the level of the power source voltage $V_{CC}$ whereby the NMOS transistor Q5 also turns to its on-state. As the operation in other respects is the same as that in the first embodiment, no explanation therefor is repeated here.

In both the first embodiment and the second embodiment, the node potentials V1 and V2 are determined by the resistors R1 through R4 so that, even if the resistance values themselves of the resistors R1 through R4 vary due to variations in the parameters involved in the course of the manufacturing process, the resistance ratios remain substantially constant and the detection level is not affected by the variations in the resistance values themselves of the resistors R1 through R4.

As has been explained hereinabove, according to the present invention, since the detection level of the substrate potential is determined by having the difference between the internal reference potential and the substrate potential and the differences between the internal reference potential and the ground potential respectively divided by the resistors concerned, the advantages are that the resistance ratios do not change even if the resistance values themselves undergo changes and that the input potentials V1 and V2 are not affected by possible manufacturing variations of the related elements.

Further, even if there are some variations in the transistors used, the input potentials V1 and V2 to be compared by the current-mirror circuit are not influenced and, since the true output N11 of the current-mirror circuit has output characteristics sufficiently sharp to the extent that any variations in the threshold values of the inverter receiving the true output can be regarded as negligible, the circuit in its entirety does not suffer from any variations in the threshold values of the transistors used and the substrate potential can be stably detected.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor integrated circuit device provided with a substrate potential detection circuit which outputs a detection signal at a detection output node when the substrate potential reaches a predetermined detection level, said circuit device comprising:
    a current-mirror circuit having a first input transistor and a second input transistor;
    a first resistor circuit in which a first and a second resistor are connected in series and which divides a potential difference between an internal reference voltage and the substrate potential and produces an input voltage to be supplied to said first input transistor;
    a first switching transistor which is connected between an internal reference voltage source and said first resistor circuit and turns-on and -off in response to a control signal inputted thereto;
    a second resistor circuit in which a third and a fourth resistor are connected in series and which divides a potential difference between said internal reference voltage and a ground potential and produces a reference voltage to be supplied to said second input transistor; and
    a second switching transistor which is connected between the internal reference voltage source and said second resistor circuit, and which turns-on and -off in response to the control signal inputted thereto.

2. A semiconductor integrated circuit device according to claim 1, in which said current-mirror circuit comprises:
    a first series circuit which is connected between a power supply source and a common junction node, and which has a P-channel MOS transistor and an N-channel MOS transistor serving as said first input transistor;
    a second series circuit which is connected between the power supply source and the common junction node, and which has a P-channel MOS transistor and an N-channel MOS transistor serving as said second input transistor; and
    a current-source N-channel MOS transistor which is connected between the common junction node and the ground.

3. A semiconductor integrated circuit device according to claim 1, in which said first switching transistor is a P-channel MOS transistor having a source connected to the internal reference voltage source and a drain connected to said first resistor circuit and a gate receiving the control signal, and said second switching transistor is a P-channel MOS transistor having a source connected to the internal reference voltage source and a drain connected to said second resistor circuit and a gate receiving the control signal commonly applied to the gate of the first switching transistor.

4. A semiconductor integrated circuit device according to claim 2, in which said current-source N-channel MOS transistor connected between the common junction node and the ground receives at its gate another control signal in response to which signal said current-source N-channel MOS transistor turns-on and -off.

5. A semiconductor integrated circuit device according to claim 1, further comprising at least one inverter connected to said detection output node, for amplifying said detection signal outputted therefrom.

* * * * *